US012309966B2

(12) United States Patent
Yang et al.

(10) Patent No.: US 12,309,966 B2
(45) Date of Patent: May 20, 2025

(54) THERMALLY CONDUCTIVE CHAMBER WITH STIFFENING STRUCTURE FOR THERMAL COOLING ASSEMBLY OF SEMICONDUCTOR CHIP PACKAGE UNDER HIGH LOADING FORCE

(71) Applicant: Intel Corporation, Santa Clara, CA (US)

(72) Inventors: Jin Yang, Hillsboro, OR (US); Jimmy Chuang, Taipei (TW); Mengqi Liu, Hillsboro, OR (US); Phil Geng, Washougal, WA (US); Ralph V. Miele, Hillsboro, OR (US); Sandeep Ahuja, Portland, OR (US); David Shia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 723 days.

(21) Appl. No.: 17/475,026

(22) Filed: Sep. 14, 2021

(65) Prior Publication Data
US 2021/0410329 A1 Dec. 30, 2021

Related U.S. Application Data

(60) Provisional application No. 63/217,058, filed on Jun. 30, 2021.

(51) Int. Cl.
*H05K 7/20* (2006.01)
*H01L 23/367* (2006.01)

(52) U.S. Cl.
CPC ..... *H05K 7/20254* (2013.01); *H01L 23/3677* (2013.01); *H05K 7/20272* (2013.01); *H05K 7/20281* (2013.01)

(58) Field of Classification Search
CPC .... G06F 1/203; G06F 1/206; G06F 2200/201; H05K 7/20; H05K 7/20254;
(Continued)

(56) References Cited

U.S. PATENT DOCUMENTS 6,212,074 B1 * 4/2001 Gonsalves .......... H01L 23/4275
174/16.3
10,548,240 B1 * 1/2020 Iyengar .............. H05K 7/20509
(Continued)

FOREIGN PATENT DOCUMENTS

GB 2576032 B 4/2021
GB 2576030 B 12/2021
(Continued)

*Primary Examiner* — Amir A Jalali
(74) *Attorney, Agent, or Firm* — Hanley, Flight & Zimmerman, LLC

(57) ABSTRACT

An apparatus is described. The apparatus includes a ceiling part and a floor part of a thermally conductive component to be placed upon a semiconductor chip package integrated heat spreader to remove heat from at least one semiconductor chip within the semiconductor chip package. Respective inner surfaces of the floor part and the ceiling part are to face one another with space in between such that one or more cavities exist within the thermally conductive component between the respective inner surfaces. The apparatus includes a frame component to be abutted against at least one of the ceiling part and the floor part to impede deformation of at least one of the ceiling part and the floor part when loading forces are applied to a thermal assembly that includes the thermally conductive component and the semiconductor chip package.

17 Claims, 9 Drawing Sheets

(58) Field of Classification Search
CPC ........... H05K 7/20263; H05K 7/20272; H05K 7/20281; H05K 7/20309; H05K 7/20327; H05K 7/20409; H05K 7/20418; H05K 7/20509; H05K 7/20772; H05K 7/20781; H05K 7/20809; H05K 7/20818; H01L 23/04; H01L 23/3672; H01L 23/3675; H01L 23/3677; H01L 23/4006; H01L 23/405; H01L 23/4056; H01L 23/427; H01L 23/433; H01L 23/473; H01L 23/49568; H01L 21/4882

See application file for complete search history.

(56) References Cited

U.S. PATENT DOCUMENTS

| | | | | |
|---|---|---|---|---|
| 2005/0141195 | A1* | 6/2005 | Pokharna | H01L 23/427 |
| | | | | 257/E23.098 |
| 2006/0050483 | A1* | 3/2006 | Wilson | H01L 23/473 |
| | | | | 361/689 |
| 2009/0195984 | A1* | 8/2009 | Meyer, IV | H01L 23/427 |
| | | | | 361/700 |
| 2015/0109735 | A1* | 4/2015 | Campbell | H05K 7/2079 |
| | | | | 361/700 |
| 2019/0004573 | A1* | 1/2019 | Kulkarni | H01L 23/473 |
| 2020/0296862 | A1* | 9/2020 | Iyengar | H05K 3/30 |
| 2021/0320050 | A1 | 10/2021 | Robinson et al. | |
| 2021/0410328 | A1* | 12/2021 | Yang | H05K 7/20254 |

FOREIGN PATENT DOCUMENTS

| | | | |
|---|---|---|---|
| GB | 2597525 A | 2/2022 | |
| GB | 2601357 A | 6/2022 | |

* cited by examiner

THERMALLY CONDUCTIVE CHAMBER WITH STIFFENING STRUCTURE FOR THERMAL COOLING ASSEMBLY OF SEMICONDUCTOR CHIP PACKAGE UNDER HIGH LOADING FORCE

RELATED CASES

This application claims the benefit of U.S. Provisional Application No. 63/217,058, entitled, "LOADING ASSEMBLY FOR TWO PHASE COOLING VAPOR CHAMBER", filed Jun. 30, 2021, which is incorporated by reference in its entirety.

BACKGROUND

System design engineers face challenges, especially with respect to high performance data center computing, as both computers and networks continue to pack higher and higher levels of performance into smaller and smaller packages. Creative packaging and cooling systems are therefore being designed to keep pace with the thermal requirements of such aggressively designed systems.

FIGURES

A better understanding of the present invention can be obtained from the following detailed description in conjunction with the following drawings, in which.

DESCRIPTION

Figure 1:
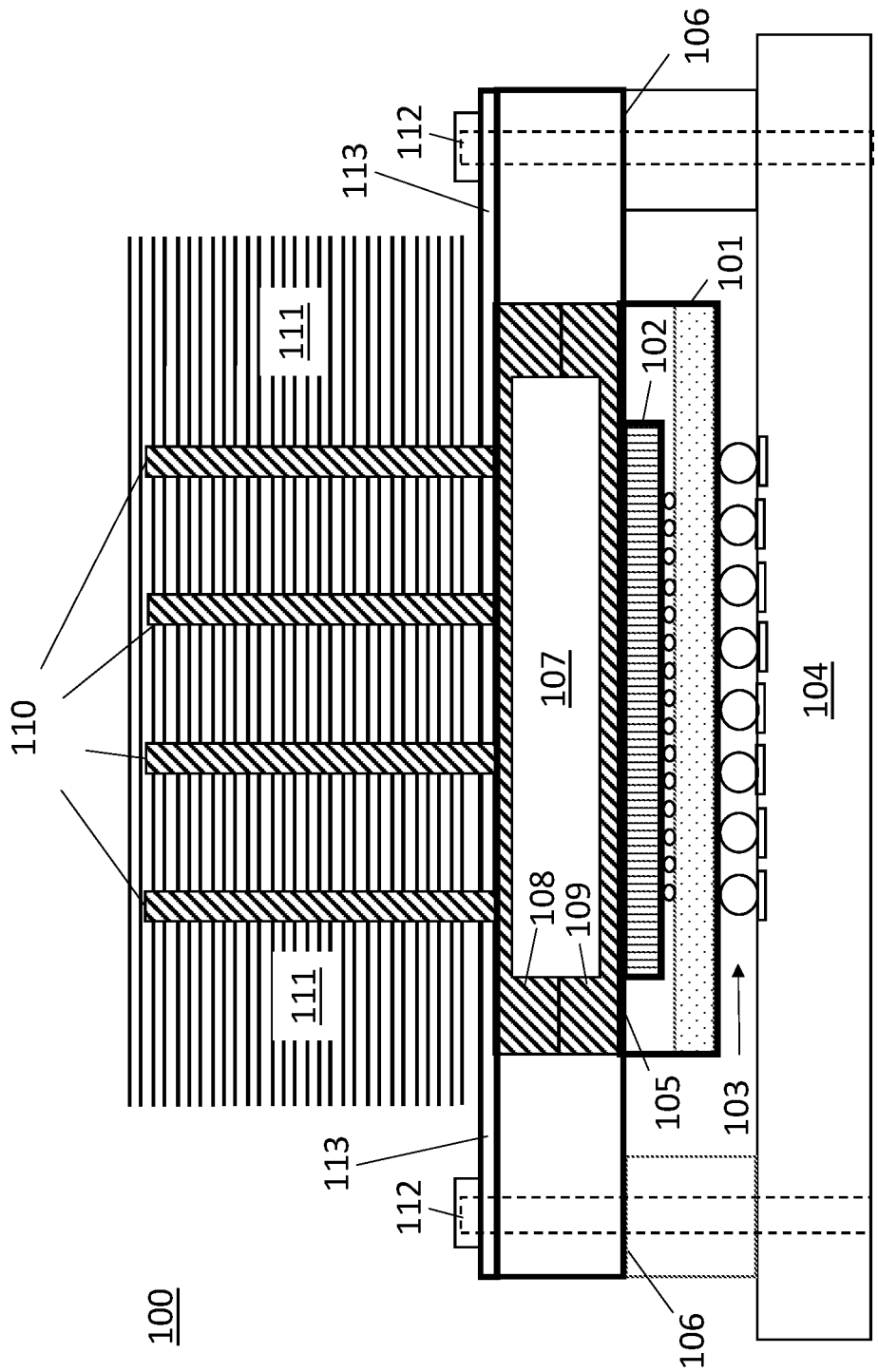
FIG. 1 shows a prior art thermal assembly.

FIG. 1 shows a prior art air cooling assembly 100 that uses a two-phase heat transfer cooling mechanism. As observed in FIG. 1, the assembly 100 includes a chip package 101 that includes one or more semiconductor chips 102 (for ease of drawing FIG. 1 only shows one semiconductor chip). The underside of the chip package 101 includes an array of inputs/outputs (I/Os) 103, such as an array of balls or an array pads/lands. The array of I/Os 103 are in electrical and mechanical contact with a corresponding array of I/Os on an electronic circuit board 104.

The chip package 101 includes a lid or integrated heat spreader (IHS) 105. The underside of the lid 105 is in thermal contact with the top surface of the semiconductor chip 102 (there can be a thermal interface material (TIM) between them).

A base component 106 is assembled onto the package IHS 105. A two-phase vapor chamber 107 is embedded in the base component 106. As observed in FIG. 1, the vapor chamber is formed 107 by a ceiling part 108 and a floor part 109 that are embedded in the base component 106. The respective inner surfaces of the ceiling and floor parts 108, 109 that face one another are any of recessed, depressed, thinned, hollowed-out, etc. to effect the shape of the chamber 107 when the ceiling part 108 and floor part 109 are pressed together.

The ceiling and floor members 108, 109 are composed of material that has high thermal conductivity (e.g., metals such as copper (Cu) or Aluminum (Al) metal alloys such as steel) and are deliberately made thin (e.g., 0.8-1.0 mm) to improve the thermal efficiency of the chamber (less temperature difference exists between the package IHS and the heat sink fins and less time is consumed heating the vapor chamber 107 to full temperature the higher the thermal conductivity and the lesser the mass of the ceiling and bottom parts 108, 109).

The ceiling part 108 also includes hollow pillars 110, which are typically heat pipes, that rise up from the top surface of the ceiling part 108 (the top surface of the ceiling part 108 is exposed along the upper surface of the base 106). Openings in the ceiling part 108 of the chamber 107 are fluidically coupled to the hollow inner regions of the pillars 110 so that the chamber 107 is fluidically coupled to the hollow regions within the pillars 110.

During operation, liquid is within the chamber 107. Heat from the operating semiconductor chip 102 is absorbed by the ceiling and floor parts 108, 109 of the chamber 107 and heats the liquid in the chamber 107 (the bottom of the floor part 108 is placed in direct thermal contact to the IHS 105). If the semiconductor chip 102 is operating at a higher performance level and dissipating higher amounts of heat, the liquid in the chamber 107 changes to a vapor phase. Vapor from the boiling liquid in the chamber 107 rises up into the hollow regions of the pillars 110 (hence chamber 107 is referred to as a vapor chamber) and brings heat from the packaged electronic device(s) to the horizontal fins where the air flow between the fins removes the heat.

The pillars 110 are inserted into and make thermal contact with a larger heat sink like structure 111. The uprightness of the pillars 110 are supported by a bracket 113. Cool air is flowed through the heat sink's fins which transfers heat from the vapor in the pillars 110 to the ambient air. The removal of heat from the vapor condenses the vapor back into a liquid where it returns to the chamber 107. The process then repeats.

Thus, heat dissipated by the semiconductor chip 102 is absorbed away from the semiconductor chip 102 and transferred to the flowing air through convection that runs through the heat sink fins 111 thereby allowing the semiconductor chip 102 to continuously operate at high performance levels.

A problem is that future generations of silicon chip manufacturing technology will drive higher performance semiconductor chips characterized by increased transistor packing densities and corresponding increased amounts of dissipated heat and increased number of I/Os. Unfortunately, the increased dissipated heat combined with the increased number of I/Os creates packaging challenges that are best met through increased loading forces applied to the packaged semiconductor chip and its cooling assembly.

A loading force is the force applied to an assembly to keep it securely mounted to a printed circuit board. In this case, referring to FIG. 1, typically, one or more of fasteners 112 (fasteners, bolts, latches, levers, etc.) are used to secure the chip package 101, the base component 106, and a bracket 113 to the electronic circuit board 104. The tightening of the fasteners 112 into the printed circuit 104 compresses and secures the assembly components 111, 113, 106, 108, 109 to the printed circuit board 104.

Unfortunately, increasing the number of chip and package I/Os 103 increases the propensity for the chip's package 101 to "pop off" the printed circuit board 104. Additionally, increasing a chip's heat dissipation translates into a larger, heavier heat sink structure 111. Both of these challenges (greater pop-off threat and heavier heat sink 111) can be met by increasing the loading force applied by the fasteners 112.

An ancillary problem, however, is that the ceiling and/or floor parts 108, 109 can structurally yield if the loading force is increased to that of future generation assemblies. The deformation can ultimately cause the ceiling and floor parts 108, 109 to lose their seal (the vapor chamber loses its "air tightness") or otherwise lose their structural integrity, which, in turn, results in an inability to increase internal pressures sufficient to induce boiling in the chamber or otherwise reduce the cooling efficiency of the overall design, and, finally, cause the silicon chip(s) in the package to fail or lose function due to over-heating.

Here, according to the mechanical design of the assembly of FIG. 1, the loading dynamics are such that the forces applied by the fasteners 112 are received by the ceiling and floor parts 108, 109. Owing to the thinness of the ceiling and floor parts 108, 109 employed to meet the high thermal performance requirements, they can/will yield or lose structural integrity if loading forces of future generation technologies are applied. As a consequence, the prior art approach of FIG. 1 can at best achieve an overall stiffness on the order of 1000 lbs/mm, whereas, assemblies for future technologies are expected to have stiffnesses on the order of 2000 lbs/mm.

FIGS. 2a, 2b, 2c and 2d show different improved designs characterized by one or more support structures (e.g., frame(s), backing plate(s), flanges, etc.) abutted against, or at least sufficiently proximate to, one or more thin regions of thin vapor chamber material. The support structure(s) are positioned to receive loading forces instead of the thin vapor chamber material thereby preserving the vapor chamber's structural integrity.

Notably, the support structure(s) have sufficient thickness and/or stiffness, and/or are positioned, to receive and withstand the loading forces without appreciably yielding. Because the support structures do not appreciably yield during the application of loading forces, the region(s) of thin vapor chamber material that the support structure(s) are designed to protect maintain structural integrity while the loading forces are being applied.

Figure 2A:
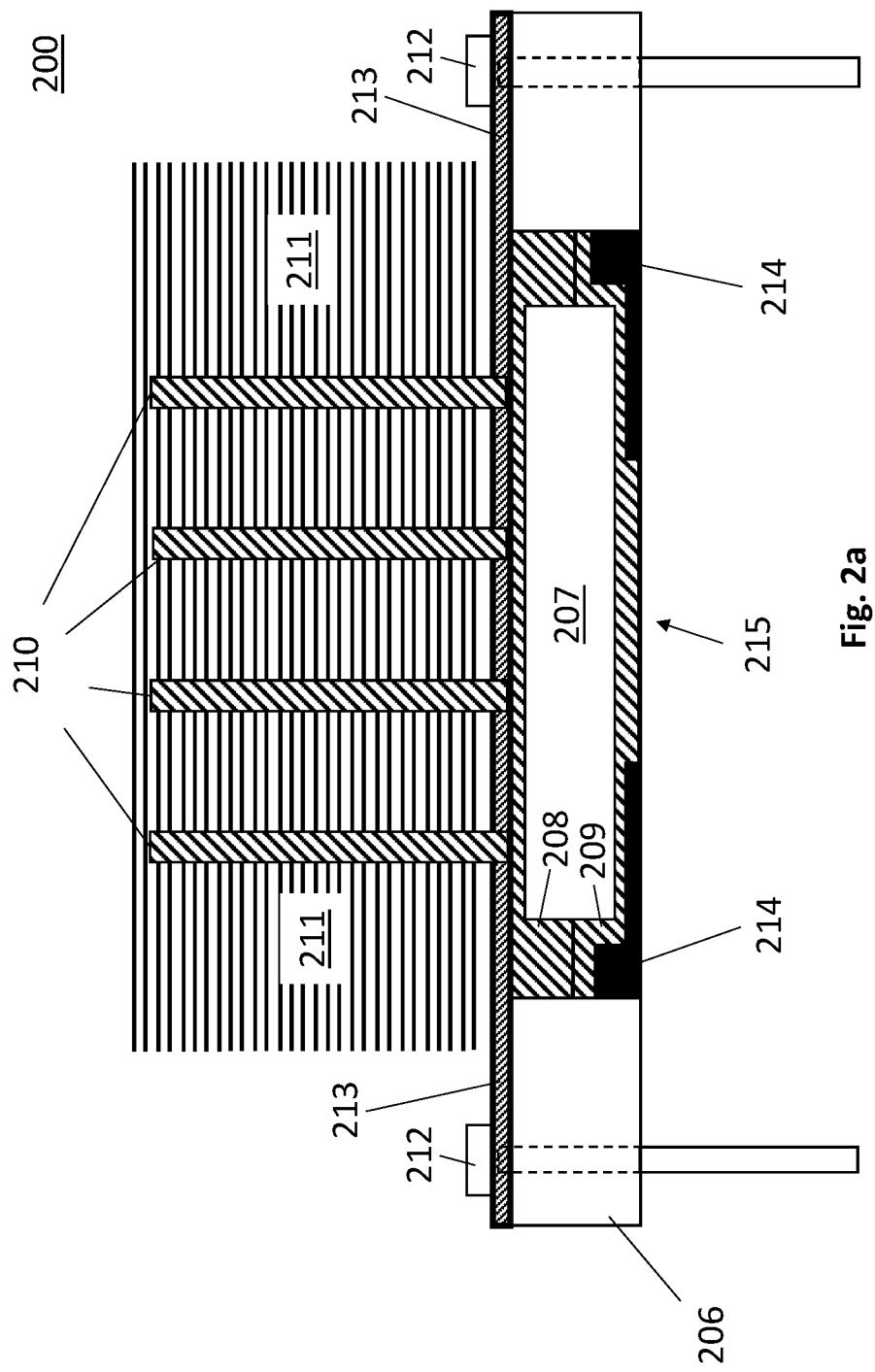
FIGS. 2a, 2b, 2c and 2d show improved vapor chamber mechanical integration designs for a thermal assembly.

FIG. 2a shows a first embodiment 200 where, like the approach of FIG. 1, a vapor chamber composed of a thin ceiling part 208 and a thin floor part 209 is embedded within a base 206. However, unlike the approach of FIG. 1, the bracket 213 not only keeps the pillars 210 in place, but also, protects the structural integrity of the ceiling part 208 of the vapor chamber 207. Here, the prior art bracket 113 of FIG. 1 is composed of a less hard material (e.g., aluminum) and/or has a thickness that can withstand the loading forces of current or prior technologies without yielding but cannot withstand the loading forces of future technologies without yielding. As described above, with respect to FIG. 1, providing structural support for the ceiling part 108 under loading forces was not a consideration of the design of the bracket 113.

By contrast, in the improved design 200 of FIG. 2a, the bracket 213 is composed of a sufficiently strong material (e.g., a tungsten alloy (e.g., tungsten rhenium), hard stainless steel, hard composite material, etc.) and/or has sufficient thickness such that the overall stiffness of the bracket 213 is able to withstand the loading forces of future technologies. Because the improved bracket 213 does not appreciably yield under application of higher dynamic loading forces, it effectively protects the ceiling part 208 from receiving the higher dynamic loading forces which preserves the structural integrity of the ceiling part 208.

Another feature of the improved design of FIG. 2a is the introduction of a supporting ring or frame 214 (hereinafter frame 214) beneath the floor part 209. Here, again with the floor part 209 (like the ceiling part 208) being composed of a thin, highly thermally conductive metal (e.g., copper), the floor part 209 and ceiling part 208 could also yield or lose structural integrity if subjected to high loading forces. The frame 214 is used to structurally stiffen or support the periphery of the bottom surface 215 of the floor part 209 that makes direct thermal contact with the package IHS.

Like the bracket 213, the frame 214 is composed of a sufficiently mechanically hard material and/or has sufficient thickness such that the overall stiffness of the frame 214 is able to withstand the loading forces of future technologies. Because the frame 214 does not appreciably yield under application of higher loading forces, it effectively protects the floor part 209 and ceiling part 208 (parts 209 and 208 are mechanically bonded and sealed together through brazing or other process) from receiving the higher loading forces which preserves the structural integrity of the floor part 209 and ceiling part 208. The opening in the frame 214 through which the bottom surface of the floor part 209 is inserted can have different shaped openings depending on the shape of the bottom surface of the floor part 209 (circular, square, etc.).

Based on proto-type samples, assemblies built according to the improvements included in FIG. 2a exhibit overall stiffnesses above 2000 lbs/mm (2004 lbs/mm, 2047 lbs/mm, 2088 lbs/mm). By contrast, as mentioned above, assemblies built according to the prior art approach of FIG. 1 could only reach stiffnesses on the order of 1000 lbs/mm. Overall assembly stiffness of 2000 lbs/mm should be suitable for the dynamic loading forces of future generation technologies which are expected to be at least 600 lbs (e.g., 800 lbs).

Figure 2B:
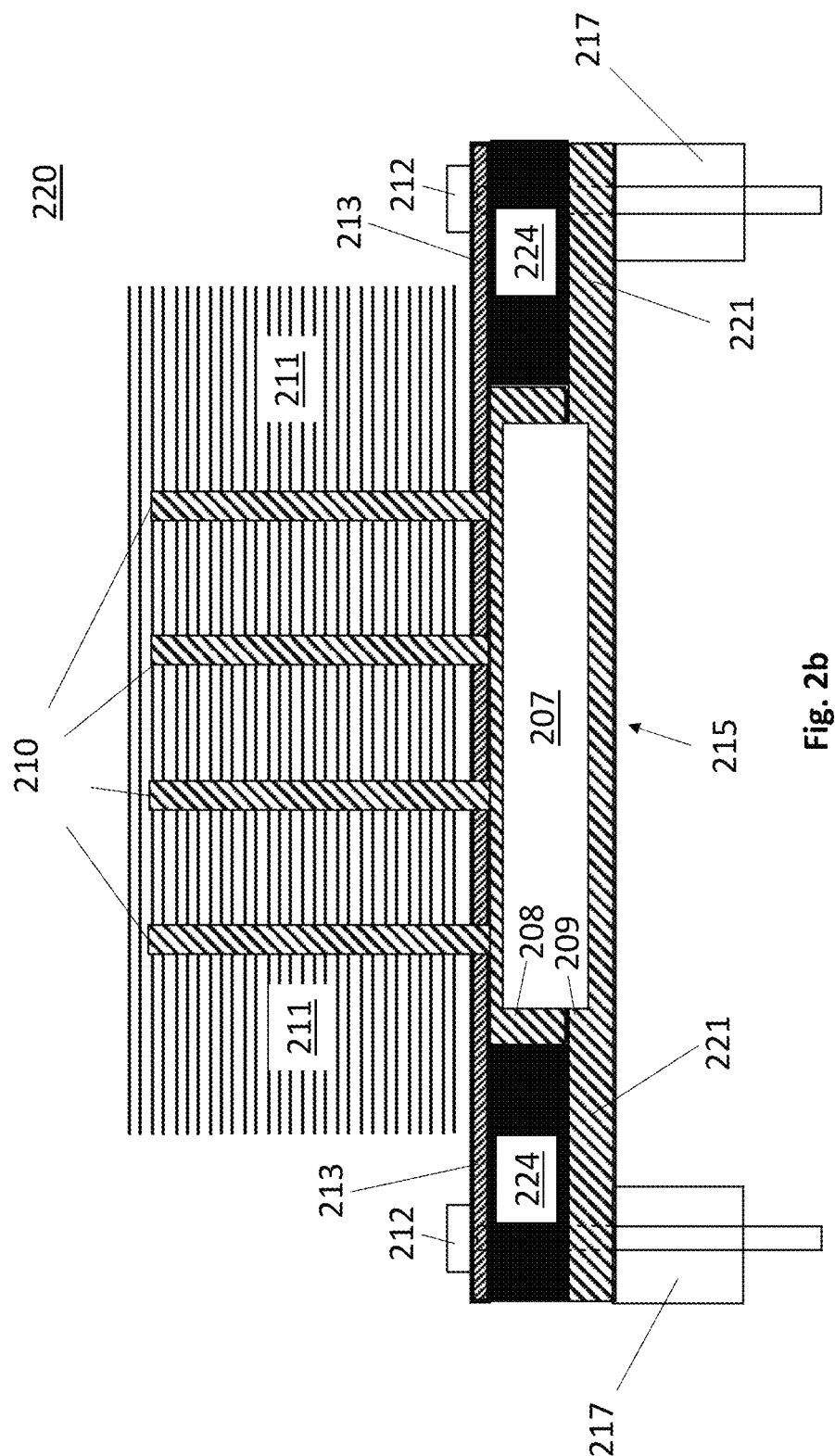

FIG. 2b shows an alternative embodiment 220 where the floor part 209 includes a flange 221 that extends outward away from the vapor chamber 207 and is mechanically compressed with the mounting hardware 217 when the fastener 212 applies the loading force. A frame 224 is located above the flange 221 and is also mechanically compressed with the mounting hardware 217 when the fastener 212 applies the loading force. The frame 224 is composed of hard material like the bracket 213 and frame 214 of the approach of FIG. 2a.

The flange 221 receives the loading forces thereby protecting the inner, thin region of the floor part 215 that forms the vapor chamber floor. The flange 221 is mechanically protected from yielding by being positioned between a frame 214 and the mounting hardware 217 both of which are composed of a sufficiently hard material and/or have sufficient thickness such that the overall stiffness of the frame/flange/hardware structure is able to withstand the higher loading forces of future technologies without appreciably yielding.

The frame 224 also provides at least some structural support for the bracket 213. As such, depending on implementation, the bracket 213 can be composed of sufficiently hard material and/or have a thickness to withstand the full weight of the loading forces by itself, or, have comparatively less hardness and/or thickness and depend of the frame 224 for at least some structural support to avoid yielding.

Figure 2C:
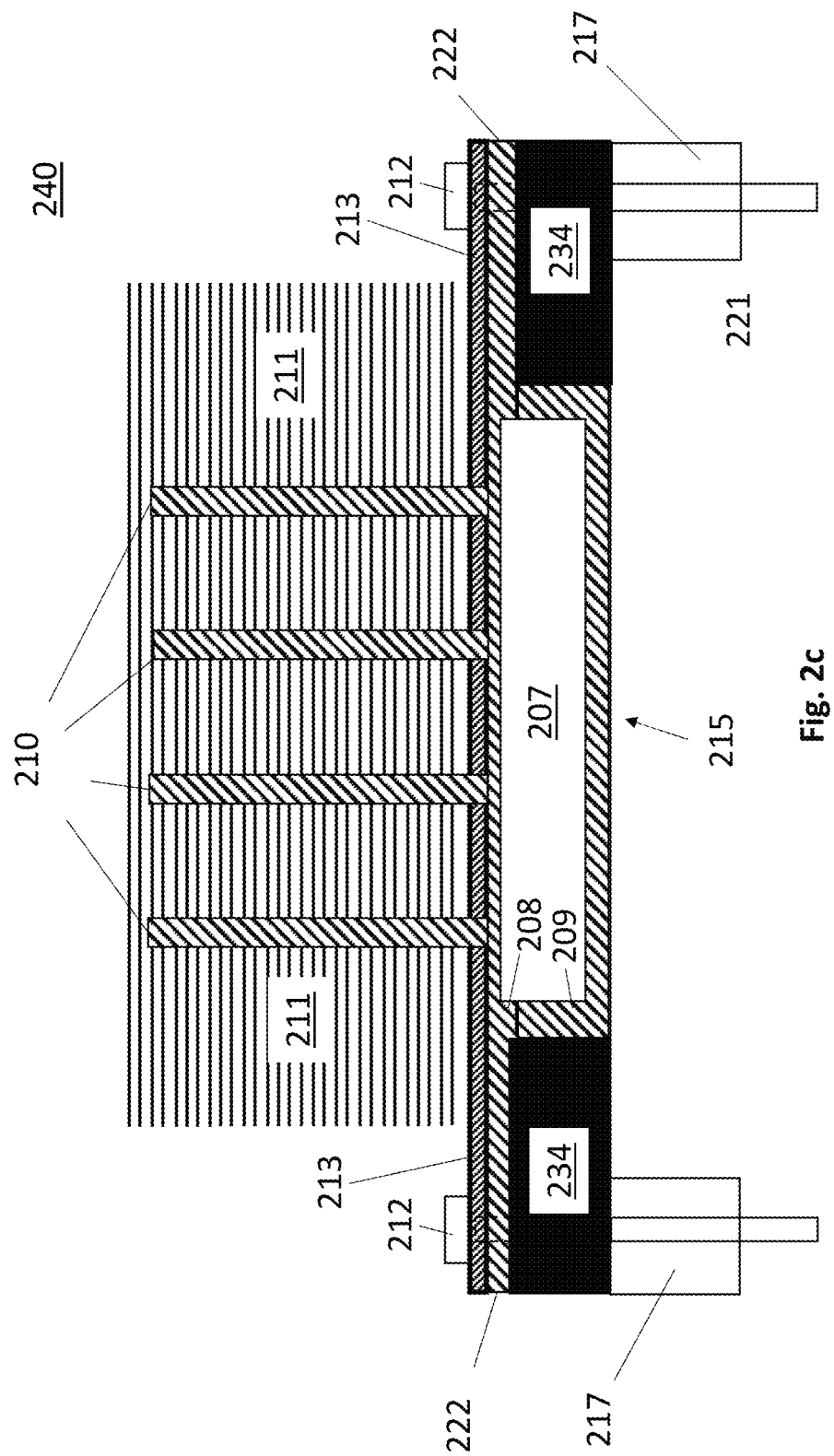

FIG. 2c shows another embodiment 240 that works similarly to the approach of FIG. 2b except that the ceiling part 208 includes the flange 222 and the frame 234 is located beneath the flange 222 instead of above the flange 222 as with the embodiment 220 of FIG. 2b.

For both the approaches of FIGS. 2b and 2c, the flanges 221, 222 increase the overall mass of the floor part (FIG. 2b) or ceiling part (FIG. 2c) as compared to the approach of FIG.

2*a* which can reduce thermal efficiency. However, owing to their wide surface area in which to receive the loading forces, the flanges 221, 222 need not be thick and can approach the thin part of the floor/ceiling of the vapor chamber in thickness thereby diminishing the thermal efficiency reduction.

Figure 2D:
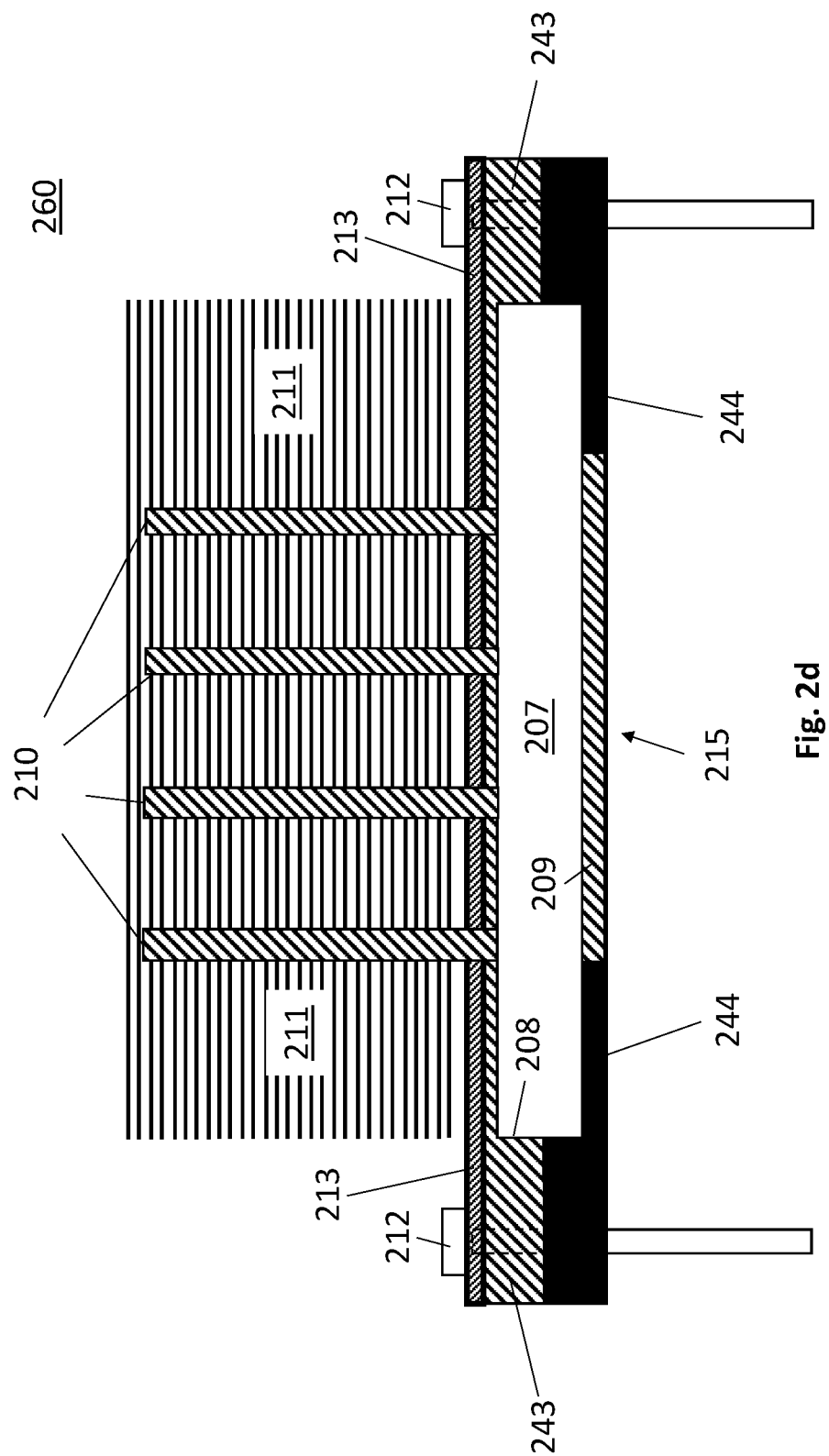

FIG. 2*d* shows another embodiment 260 where the periphery 243 of the top part 208 is thickened so that it can withstand loading forces and form an upper (e.g., half) part of the inner sidewall of the vapor chamber 207. The frame 244 resides beneath the thickened periphery 234 of the top part 208 and forms a lower (e.g., half) part of the inner sidewall of the vapor chamber 207. The frame 244 also forms a peripheral part of the floor of the vapor chamber 207. The bottom part 209 forms an inner part of the floor of the vapor chamber 207. In an embodiment, the bottom part 209 is welded or brazed to the frame 244 so that the two components form one integral piece prior to integration into the cooling assembly.

In an alternate embodiment the bottom part has the thickened periphery and the frame resides above the bottom part's thickened periphery. In this case, the frame helps form an upper inner sidewall of the vapor chamber and a periphery of the vapor chamber ceiling. The top part forms an inner part of the ceiling. The top part and frame are welded/brazed together prior to integration into the cooling assembly.

Although the discussion above has been directed at two phase vapor solutions that also employ air cooling, the teachings above can also be applied to the channels and/or chambers associated with traditional liquid cooling.

In the case of traditional liquid cooling, liquid is flowed through one or more structures similar to the ceiling and floor parts of the vapor chamber described above (the ceiling and floor parts are together referred to as a "cold plate"). Here, for example, both a ceiling part and a floor part have grooves/channels/walls such that one or more fluidic channels are formed between the inner surfaces of the ceiling and floor parts that face one another when the two part are pressed together. Additionally, the grooves/channels/walls in the ceiling and/or floor parts are shaped to form at least one fluidic input port and at least one fluidic output port.

During operation, liquid coolant enters the fluidic input port(s) and runs through the channel(s) that are formed between the ceiling and floor parts. While running through the channel(s) the liquid coolant absorbs heat from the semiconductor chip. The warmed fluid then exits the fluidic output port(s).

Importantly, the ceiling and floor parts of a liquid cooling cold plate (or even a liquid cooling cold plate composed of a single slab of material with holes drilled through it) share characteristics with the ceiling and floor parts of a two phase vapor chamber that lend themselves to being improved if they are incorporated with the teachings above. Most notably, as with the two phase vapor chamber ceiling and floor parts, a traditional liquid cooling cold plate is structured to have internal open space(s) and is generally made thin to promote thermal cooling efficiency. As such, a traditional cold plate can similarly suffer from yielding problems when future generation loading forces are applied.

Therefore, the designs of liquid cooling cold plates can likewise include any of the structural elements discussed above 213, 214, 224 to avoid deformation. Here, the ceiling and floor parts 208, 209 of FIGS. 2*a*, 2*b* and 2*c* should be understood to be replaced by ceiling and floor parts, or a single block, having one or more fluidic channels therein and having at least one fluidic input port and at least one fluidic output port.

Moreover, although the discussions of the improvements of FIGS. 2*a*, 2*b* and 2*c* were directed to a two phase solution where the liquid coolant was self contained in the chip package cooling hardware, other two phase cooling solutions are designed to route vapor out of the vapor chamber component to external cooling equipment and then route condensed, cooled liquid back into the vapor chamber.

Figure 3:
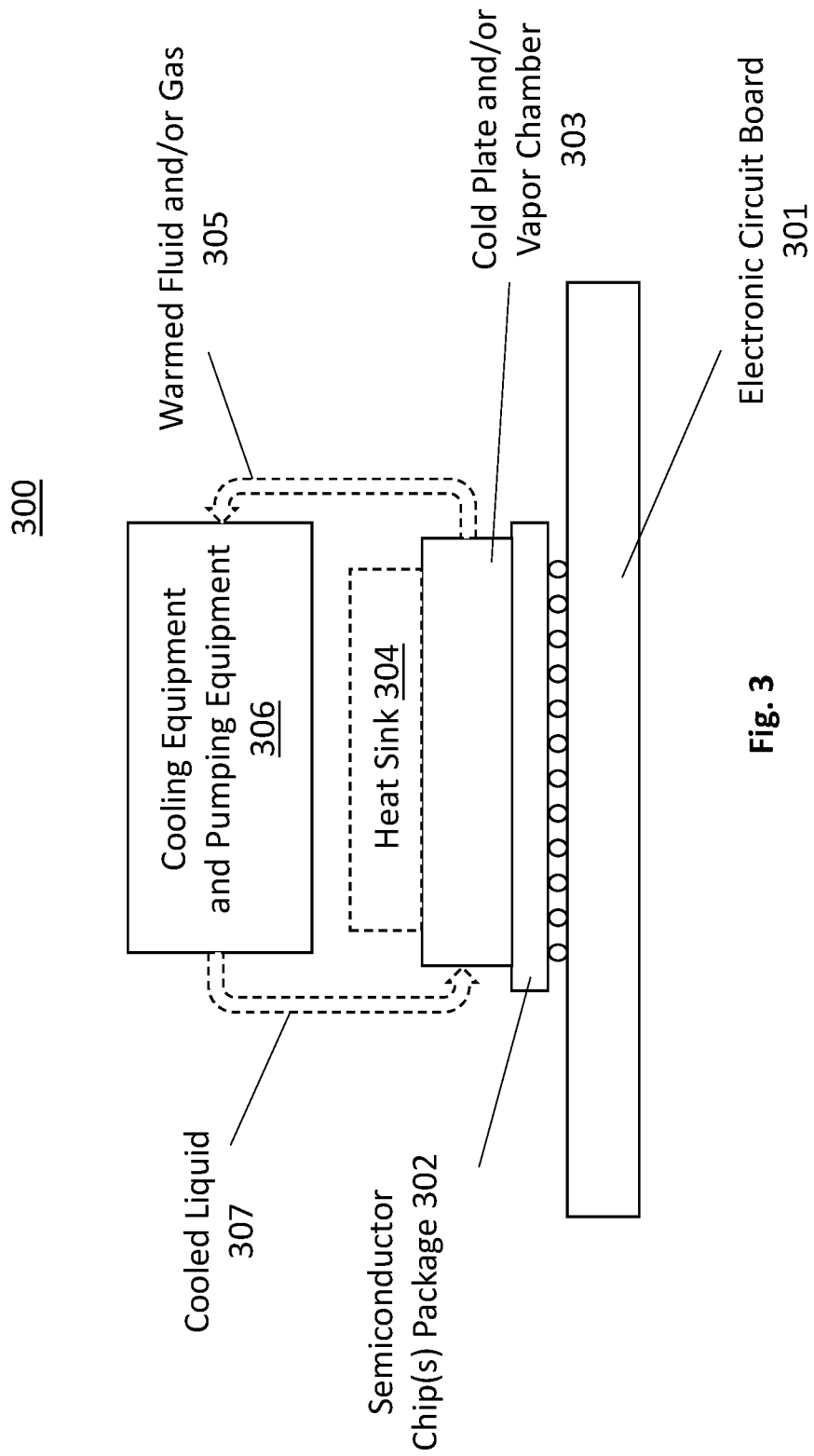
FIG. 3 shows a cooling system.

As such, at least with respect to traditional liquid cooled implementations and two phase cooling systems as described immediately above, the teachings above can be applied to the cooling apparatus 300 of FIG. 3. FIG. 3 depicts a general cooling apparatus 300 whose features can be found in many different kinds of semiconductor chip cooling systems. As observed in FIG. 3, one or more semiconductor chips within a package 302 are mounted to an electronic circuit board 301. A cold plate 303 is thermally coupled with the package 302 (e.g., by being placed on the package 302 with a thermally conductive material ("thermal interface material") between them) so that the cold plate 303 receives heat generated by the one or more semiconductor chips (the cold plate 303 can also be referred to as a vapor chamber in the case of two phase cooling systems).

Liquid coolant is within the cold plate 303. If the system also employs air cooling (optional), a heat sink 304 can be thermally coupled to the cold plate 303. Warmed liquid coolant and/or vapor 305 leaves the cold plate 303 to be cooled by one or more items of cooling equipment (e.g., heat exchanger(s), radiator(s), condenser(s), refrigeration unit(s), etc.) and pumped by one or more items of pumping equipment (e.g., dynamic (e.g., centrifugal), positive displacement (e.g., rotary, reciprocating, etc.)) 306. Cooled liquid 307 then enters the cold plate 303 and the process repeats.

With respect to the cooling equipment and pumping equipment 306, cooling activity can precede pumping activity, pumping activity can precede cooling activity, or multiple stages of one or both of pumping and cooling can be intermixed (e.g., in order of flow: a first cooling stage, a first pumping stage, a second cooling stage, a second pumping stage, etc.) and/or other combinations of cooling activity and pumping activity can take place.

Moreover, the intake of any equipment of the cooling equipment and pumping equipment 306 can be supplied by the cold plate of one semiconductor chip package or the respective cold plate(s) of multiple semiconductor chip packages.

In the case of the later (intake received from cold plate(s) of multiple semiconductor chip packages), the semiconductor chip packages can be components on a same electronic circuit board or multiple electronic circuit boards. In the case of the later (multiple electronic circuit boards), the multiple electronic circuit boards can be components of a same electronic system (e.g., different boards in a same server computer) or different electronic systems (e.g., electronic circuit boards from different server computers). In essence, the general depiction of FIG. 3 describes compact cooling systems (e.g., a cooling system contained within a single electronic system), expansive cooling systems (e.g., cooling systems that cool the components of any of a rack, multiple racks, a data center, etc.) and cooling systems in between.

FIG. 3 also describes immersion cooling systems where it is understood that the warmed fluid and/or vapor flow 305 is from the immersion bath chamber (not shown for illustrative ease) and the cooled fluid flow is 307 is into the immersion bath chamber. Here, the various vapor chambers described above can be utilized in an immersion cooled system where, e.g., boiling in the vapor chamber is used to enhance thermal transfer to the immersion bath.

In various embodiments of the above mechanical designs the heat sink 211 is not present. In at least some of these embodiments the heat sink 211 is replaced with another thermal transfer structure (such as a boiling plate for immersion cooled systems having a roughened and/or porous surface).

Note that one or both of the ceiling and floor parts need not have planar surfaces. For example, the ceiling and/or floor parts can have curved surfaces (e.g., dome-like). Such non planar surfaces can face another surface (non-planar, flat or otherwise). That is, a surface need not be flat to face another surface.

Figure 4:
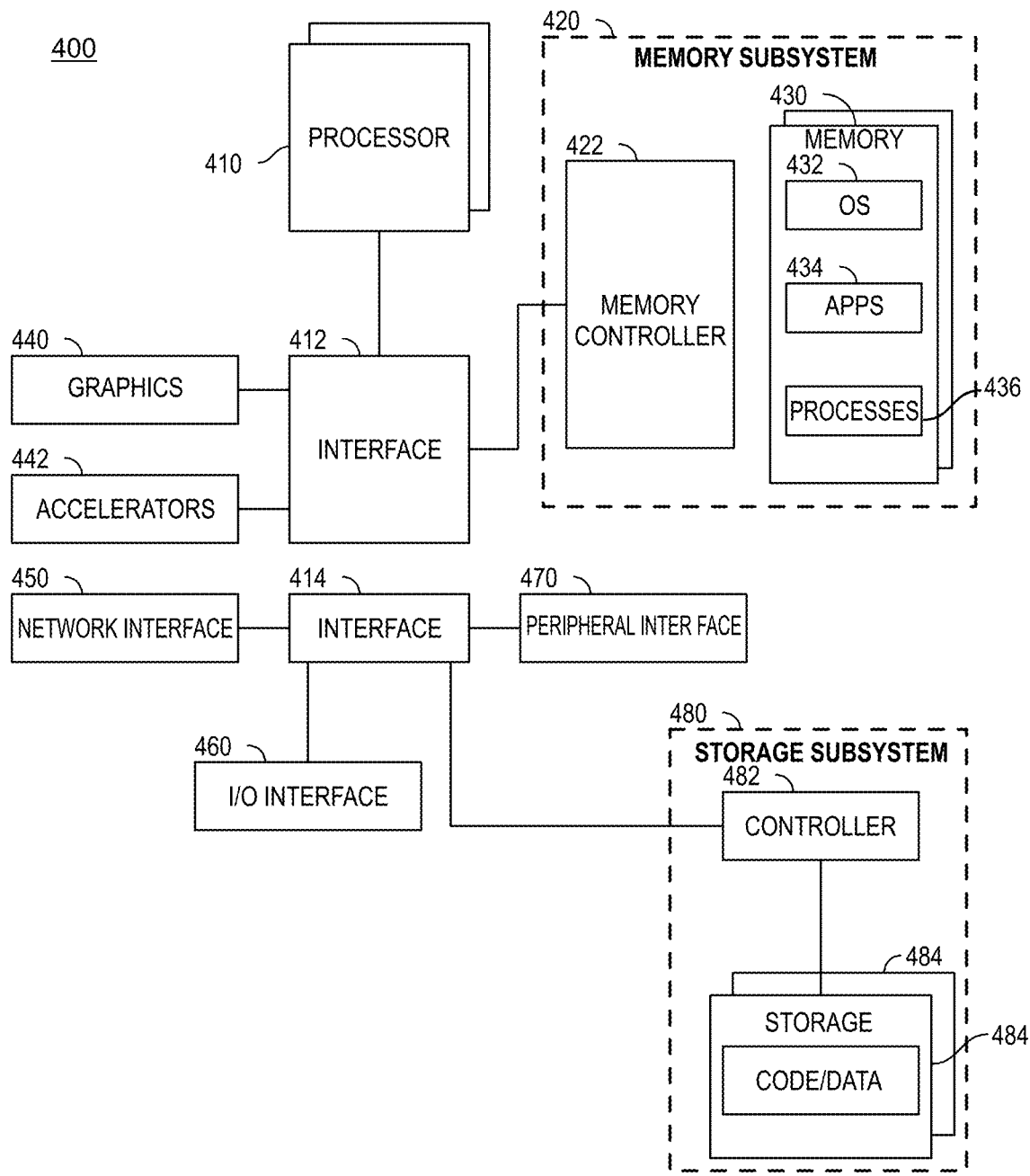
FIG. 4 shows a system.
Figure 5:
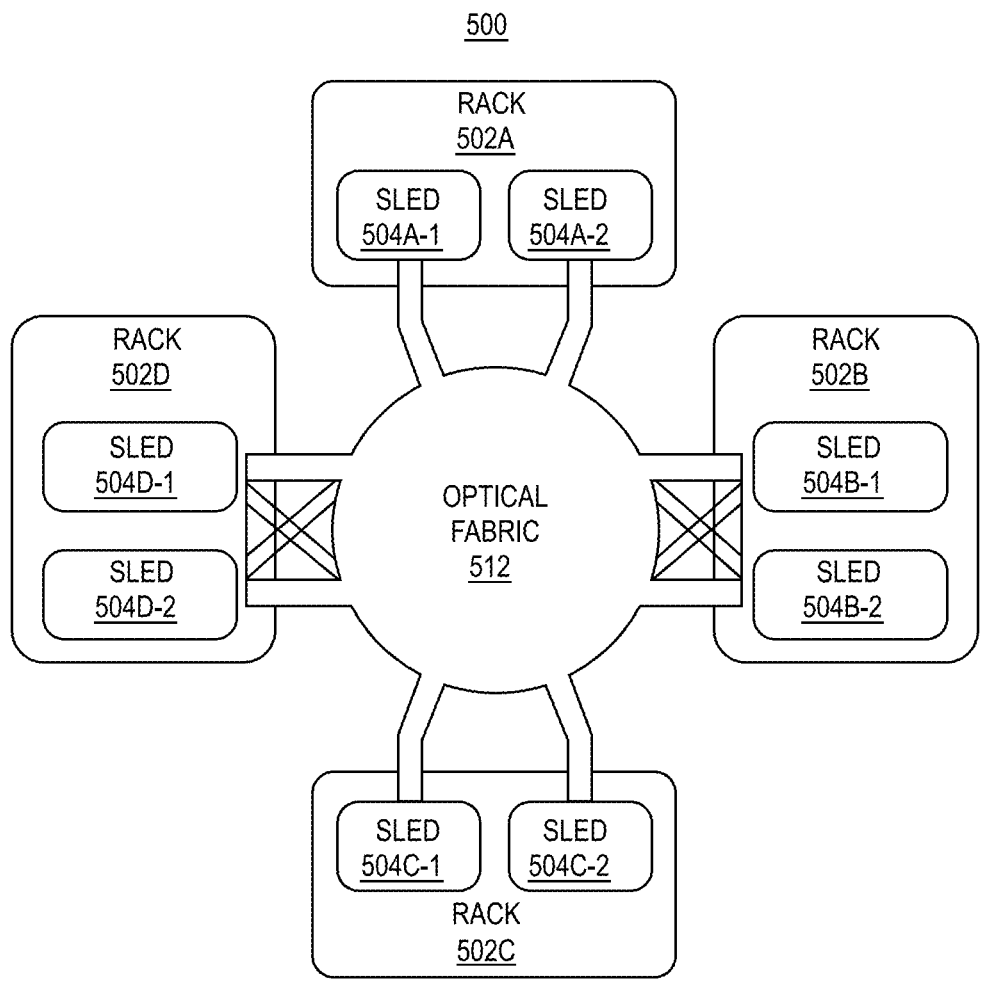
FIG. 5 shows a data center.
Figure 6:
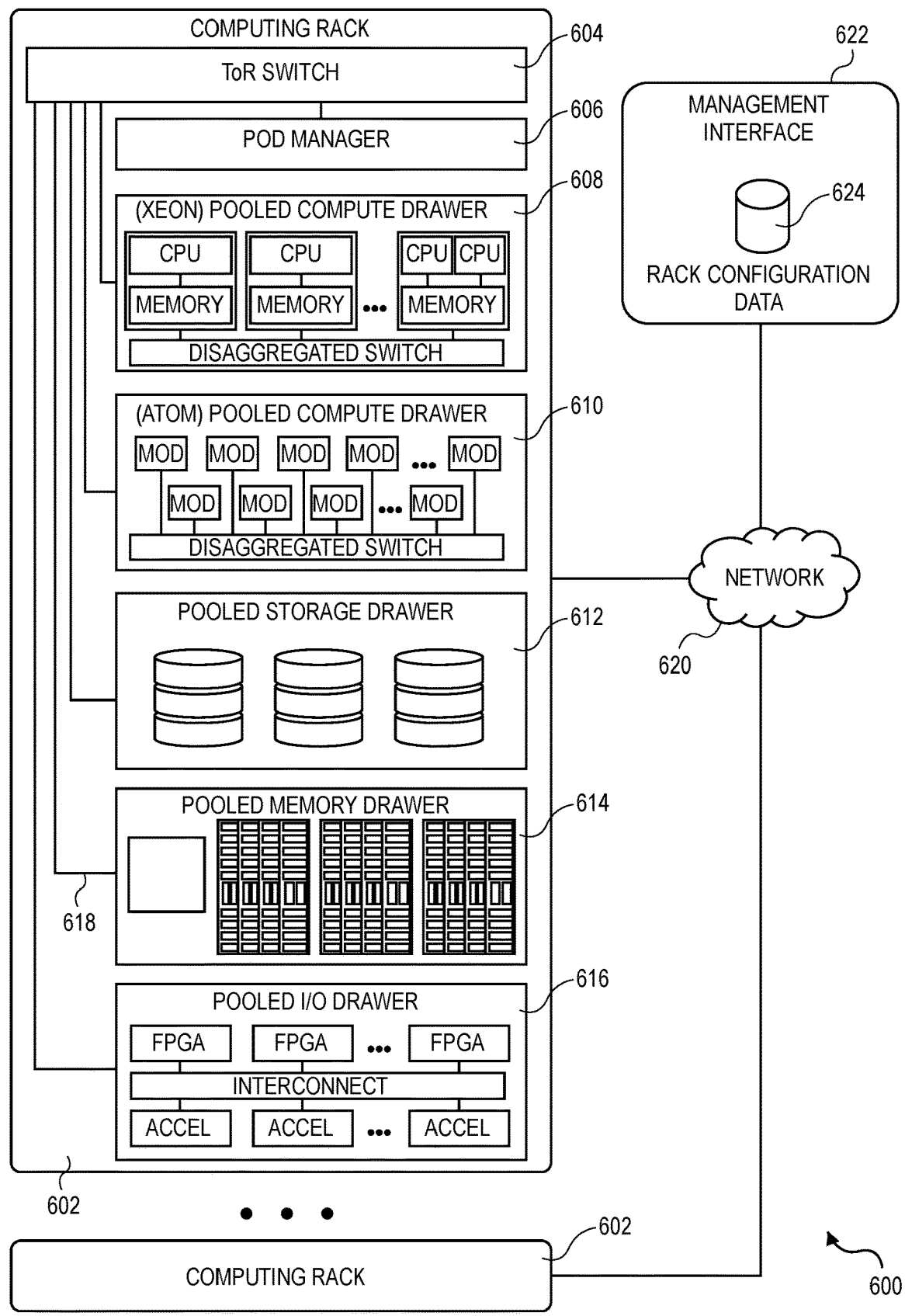
FIG. 6 shows a rack.

The following discussion concerning FIGS. 4, 5 and 6 are directed to systems, data centers and rack implementations, generally. It is pertinent to point out that any packaged electronic component and/or electro-optic component on any electronic circuit board of any of the systems, data centers and rack implementations described below can be mounted with hardware according to the teachings discussed at length just above.

FIG. 4 depicts an example system. System 400 includes processor 410, which provides processing, operation management, and execution of instructions for system 400. Processor 410 can include any type of microprocessor, central processing unit (CPU), graphics processing unit (GPU), processing core, or other processing hardware to provide processing for system 400, or a combination of processors. Processor 410 controls the overall operation of system 400, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Certain systems also perform networking functions (e.g., packet header processing functions such as, to name a few, next nodal hop lookup, priority/flow lookup with corresponding queue entry, etc.), as a side function, or, as a point of emphasis (e.g., a networking switch or router). Such systems can include one or more network processors to perform such networking functions (e.g., in a pipelined fashion or otherwise).

In one example, system 400 includes interface 412 coupled to processor 410, which can represent a higher speed interface or a high throughput interface for system components that needs higher bandwidth connections, such as memory subsystem 420 or graphics interface components 440, or accelerators 442. Interface 412 represents an interface circuit, which can be a standalone component or integrated onto a processor die. Where present, graphics interface 440 interfaces to graphics components for providing a visual display to a user of system 400. In one example, graphics interface 440 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 440 generates a display based on data stored in memory 430 or based on operations executed by processor 410 or both. In one example, graphics interface 440 generates a display based on data stored in memory 430 or based on operations executed by processor 410 or both.

Accelerators 442 can be a fixed function offload engine that can be accessed or used by a processor 410. For example, an accelerator among accelerators 442 can provide compression (DC) capability, cryptography services such as public key encryption (PKE), cipher, hash/authentication capabilities, decryption, or other capabilities or services. In some embodiments, in addition or alternatively, an accelerator among accelerators 442 provides field select controller capabilities as described herein. In some cases, accelerators 442 can be integrated into a CPU socket (e.g., a connector to a motherboard or circuit board that includes a CPU and provides an electrical interface with the CPU). For example, accelerators 442 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 442 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 420 represents the main memory of system 400 and provides storage for code to be executed by processor 410, or data values to be used in executing a routine. Memory subsystem 420 can include one or more memory devices 430 such as read-only memory (ROM), flash memory, volatile memory, or a combination of such devices. Memory 430 stores and hosts, among other things, operating system (OS) 432 to provide a software platform for execution of instructions in system 400. Additionally, applications 434 can execute on the software platform of OS 432 from memory 430. Applications 434 represent programs that have their own operational logic to perform execution of one or more functions. Processes 436 represent agents or routines that provide auxiliary functions to OS 432 or one or more applications 434 or a combination. OS 432, applications 434, and processes 436 provide software logic to provide functions for system 400. In one example, memory subsystem 420 includes memory controller 422, which is a memory controller to generate and issue commands to memory 430. It will be understood that memory controller 422 could be a physical part of processor 410 or a physical part of interface 412. For example, memory controller 422 can be an integrated memory controller, integrated onto a circuit with processor 410. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory), JESD235, originally published by JEDEC in October 2013, LPDDR5, HBM2 (HBM version 2), or others or combinations of memory technologies, and technologies based on derivatives or extensions of such specifications.

In various implementations, memory resources can be "pooled". For example, the memory resources of memory modules installed on multiple cards, blades, systems, etc. (e.g., that are inserted into one or more racks) are made available as additional main memory capacity to CPUs and/or servers that need and/or request it. In such implementations, the primary purpose of the cards/blades/systems is to provide such additional main memory capacity. The cards/blades/systems are reachable to the CPUs/servers that use the memory resources through some kind of network infrastructure such as CXL, CAPI, etc.

While not specifically illustrated, it will be understood that system 400 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), Cache Coherent Interconnect for Accelerators (CCIX), Open Coherent Accelerator Processor (Open CAPI) or other specification developed by the Gen-z consortium, a universal serial bus (USB), or an Institute of Electrical and Electronics Engineers (IEEE) standard 1394 bus.

In one example, system 400 includes interface 414, which can be coupled to interface 412. In one example, interface 414 represents an interface circuit, which can include stand-alone components and integrated circuitry. In one example, multiple user interface components or peripheral components, or both, couple to interface 414. Network interface 450 provides system 400 the ability to communicate with remote devices (e.g., servers or other computing devices) over one or more networks. Network interface 450 can include an Ethernet adapter, wireless interconnection components, cellular network interconnection components, USB (universal serial bus), or other wired or wireless standards-based or proprietary interfaces. Network interface 450 can transmit data to a remote device, which can include sending data stored in memory. Network interface 450 can receive data from a remote device, which can include storing received data into memory. Various embodiments can be used in connection with network interface 450, processor 410, and memory subsystem 420.

In one example, system 400 includes one or more input/output (I/O) interface(s) 460. I/O interface 460 can include one or more interface components through which a user interacts with system 400 (e.g., audio, alphanumeric, tactile/touch, or other interfacing). Peripheral interface 470 can include any hardware interface not specifically mentioned above. Peripherals refer generally to devices that connect dependently to system 400. A dependent connection is one where system 400 provides the software platform or hardware platform or both on which operation executes, and with which a user interacts.

In one example, system 400 includes storage subsystem 480 to store data in a nonvolatile manner. In one example, in certain system implementations, at least certain components of storage 480 can overlap with components of memory subsystem 420. Storage subsystem 480 includes storage device(s) 484, which can be or include any conventional medium for storing large amounts of data in a nonvolatile manner, such as one or more magnetic, solid state, or optical based disks, or a combination. Storage 484 holds code or instructions and data in a persistent state (e.g., the value is retained despite interruption of power to system 400). Storage 484 can be generically considered to be a "memory," although memory 430 is typically the executing or operating memory to provide instructions to processor 410. Whereas storage 484 is nonvolatile, memory 430 can include volatile memory (e.g., the value or state of the data is indeterminate if power is interrupted to system 400). In one example, storage subsystem 480 includes controller 482 to interface with storage 484. In one example controller 482 is a physical part of interface 414 or processor 410 or can include circuits or logic in both processor 410 and interface 414.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 400. More specifically, power source typically interfaces to one or multiple power supplies in system 400 to provide power to the components of system 400. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 400 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 5 depicts an example of a data center. Various embodiments can be used in or with the data center of FIG. 5. As shown in FIG. 5, data center 500 may include an optical fabric 512. Optical fabric 512 may generally include a combination of optical signaling media (such as optical cabling) and optical switching infrastructure via which any particular sled in data center 500 can send signals to (and receive signals from) the other sleds in data center 500. However, optical, wireless, and/or electrical signals can be transmitted using fabric 512. The signaling connectivity that optical fabric 512 provides to any given sled may include connectivity both to other sleds in a same rack and sleds in other racks.

Data center 500 includes four racks 502A to 502D and racks 502A to 502D house respective pairs of sleds 504A-1 and 504A-2, 504B-1 and 504B-2, 504C-1 and 504C-2, and 504D-1 and 504D-2. Thus, in this example, data center 500 includes a total of eight sleds. Optical fabric 512 can provide sled signaling connectivity with one or more of the seven other sleds. For example, via optical fabric 512, sled 504A-1 in rack 502A may possess signaling connectivity with sled 504A-2 in rack 502A, as well as the six other sleds 504B-1, 504B-2, 504C-1, 504C-2, 504D-1, and 504D-2 that are distributed among the other racks 502B, 502C, and 502D of data center 500. The embodiments are not limited to this example. For example, fabric 512 can provide optical and/or electrical signaling.

FIG. 6 depicts an environment 600 that includes multiple computing racks 602, each including a Top of Rack (ToR) switch 604, a pod manager 606, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 608, and INTEL® ATOM™ pooled compute drawer 610, a pooled storage drawer 612, a pooled memory drawer 614, and a pooled I/O drawer 616. Each of the pooled system drawers is connected to ToR switch 604 via a high-speed link 618, such as a 40 Gigabit/second (Gb/s) or 100 Gb/s Ethernet link or an 100+Gb/s Silicon Photonics (SiPh) optical link. In one embodiment high-speed link 618 comprises an 600 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 600 may be interconnected via their ToR switches 604 (e.g., to a pod-level switch or data center switch), as illustrated by connections to a network 620. In some embodiments, groups of computing racks 602 are managed as separate pods via pod manager(s) 606. In one embodiment, a single pod manager is used to manage all of the racks in the pod. Alternatively, distributed pod managers may be used for pod management operations. RSD environment 600 further includes a management interface 622 that is used to manage various aspects of the RSD environment. This includes managing rack configuration, with corresponding parameters stored as rack configuration data 624.

Any of the systems, data centers or racks discussed above, apart from being integrated in a typical data center, can also be implemented in other environments such as within a bay station, or other micro-data center, e.g., at the edge of a network.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

To the extent any of the teachings above can be embodied in a semiconductor chip, a description of a circuit design of the semiconductor chip for eventual targeting toward a semiconductor manufacturing process can take the form of various formats such as a (e.g., VHDL or Verilog) register transfer level (RTL) circuit description, a gate level circuit description, a transistor level circuit description or mask description or various combinations thereof. Such circuit descriptions, sometimes referred to as "IP Cores", are commonly embodied on one or more computer readable storage media (such as one or more CD-ROMs or other type of storage technology) and provided to and/or otherwise processed by and/or for a circuit design synthesis tool and/or mask generation tool. Such circuit descriptions may also be embedded with program code to be processed by a computer that implements the circuit design synthesis tool and/or mask generation tool.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences may also be performed according to alternative embodiments. Furthermore, additional sequences may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
a ceiling part and a floor part of a thermally conductive component to be placed upon an integrated heat spreader to remove heat from at least one semiconductor chip within a semiconductor chip package associated with the integrated heat spreader, the floor part and the ceiling part to be pressed against one another to form the thermally conductive component, one or more cavities exist within the thermally conductive component between respective inner surfaces of the floor part and the ceiling part that face one another when the floor part and the ceiling part are pressed against one another; and
a frame component to be abutted against at least one of the ceiling part or the floor part to impede deformation of at least one of the ceiling part or the floor part when loading forces are being applied to a thermal assembly that includes the thermally conductive component and the semiconductor chip package, the frame component to reside between the floor part and the integrated heat spreader.

2. The apparatus of claim 1 wherein the thermally conductive component includes a vapor chamber for a two-phase cooling system.

3. The apparatus of claim 1 wherein the thermally conductive component includes a cold plate for a liquid cooling system.

4. The apparatus of claim 1 wherein the ceiling part includes a flange and the frame component is to be abutted against the flange.

5. The apparatus of claim 1 wherein the floor part includes a flange and the frame component is to be abutted against the flange.

6. The apparatus of claim 1 wherein a thickest part of the frame component is thicker than a thinnest respective part of the ceiling part and the floor part.

7. A data center, comprising:
a plurality of computing systems housed in racks communicatively coupled to one another by at least one network;
a liquid cooling system including pumping equipment and cooling equipment; and
a thermal assembly upon a semiconductor chip package within one of the plurality of computing systems to remove heat from at least one semiconductor chip within the semiconductor chip package, the thermal assembly including:
  a thermally conductive component in direct thermal contact with an integrated heat spreader of the semiconductor chip package, the thermally conductive component having a floor part and a ceiling part, the floor part and the ceiling part being pressed against one another and structured to define one or more cavities within the thermally conductive component between respective inner surfaces of the ceiling part and the floor part, the thermally conductive component fluidically coupled to the liquid cooling system with an exit port to emit warmed vapor and/or liquid coolant and an input port to receive cooled liquid coolant; and
  a frame component abutted against at least one of the ceiling part or the floor part, the frame component to impede deformation of at least one of the ceiling part or the floor part when loading forces are applied to the thermal assembly, the frame component is to reside between the floor part and the integrated heat spreader.

8. The data center of claim 7 wherein the thermally conductive component includes a vapor chamber for a two-phase cooling system.

9. The data center of claim 7 wherein the thermally conductive component includes a cold plate associated with the liquid cooling system.

10. The data center of claim 7 wherein the ceiling part includes a flange and the frame component is to be abutted against the flange.

11. The data center of claim 7 wherein the floor part includes a flange and the frame component is to be abutted against the flange.

12. The data center of claim 7 wherein a thickest part of the frame component is thicker than a thinnest respective part of the ceiling part and the floor part.

13. A method, comprising:
mechanically integrating a ceiling part and a floor part of a thermally conductive component upon an integrated heat spreader of a semiconductor chip package, wherein respective inner surfaces of the ceiling part and the floor part are to form at least one cavity within the thermally conductive component;
abutting a frame component against at least one of the ceiling part or the floor part, the frame component to reside between the floor part and the integrated heat spreader; and
applying loading forces to secure a thermal assembly that includes the thermally conductive component and the frame component to an electronic circuit board, wherein the ceiling part and the floor part maintain their structural integrity during the applying of the loading forces.

14. The method of claim 13 wherein the ceiling part includes a flange and the frame component presses against the flange during the applying of the loading forces.

15. The method of claim 13 wherein the floor part includes a flange and the frame component presses against the flange during the applying of the loading forces.

16. The method of claim 13 wherein the thermally conductive component includes a vapor chamber for a two-phase cooling system.

17. The method of claim 13 wherein the thermal conductive component includes a cold plate for a liquid cooling system.

* * * * *